United States Patent [19]

Watanabe et al.

[11] 3,896,076

[45] July 22, 1975

[54] ADHESIVE COMPOSITION FOR FLEXIBLE PRINTED CIRCUIT AND METHOD FOR USING THE SAME

[75] Inventors: Tsutomu Watanabe; Shigenori Yamaoka; Koichi Tanaka, all of Yokohama, Japan

[73] Assignee: Sumitomo Bakelite Company, Limited, Tokyo, Japan

[22] Filed: Dec. 11, 1973

[21] Appl. No.: 423,708

[30] Foreign Application Priority Data

June 20, 1973 Japan ............................... 48-68802

[52] U.S. Cl. ........... 260/40 R; 260/37 EP; 260/835; 260/836

[51] Int. Cl. ........................................... C08g 51/04

[58] Field of Search ........... 260/830 P, 75 TN, 835, 260/40 TN, 37 EP

[56] References Cited

UNITED STATES PATENTS 3,238,273 3/1966 Hampson et al. .............. 260/830 P

*Primary Examiner*—Lewis T. Jacobs

*Attorney, Agent, or Firm*—Karl W. Flocks

[57] ABSTRACT

As an adhesive used for a laminate for a flexible printed circuit, there is provided an adhesive composition comprising as the essential components a polyester resin, an isocyanate compound, and a B-stage epoxy resin.

This composition is excellent in flow property and rapid curability and is suitable for use in a continuous adhesion between a plastic insulating film and a conductive foil by means of a roll-laminator and it affords an excellent characteristic to the laminate for a printed circuit.

There is also provided an adhesive composition which contains, in addition to the above ingredients, a styrene copolymer comprising maleic anhydride, or an alkyl maleate as a structural unit, or a metallic salt of an aliphatic carboxylic acid in order to prevent blocking and promote curing of the adhesive in a roll laminating process.

The addition of a small amount of a pigment results in an adhesive composition which is effective in the economical production of a laminate for a colored flexible printed circuit, and which has the effect of preventing the blocking and improving the weather resistance of the adhesive.

8 Claims, No Drawings

ADHESIVE COMPOSITION FOR FLEXIBLE PRINTED CIRCUIT AND METHOD FOR USING THE SAME

The present invention relates to an adhesive composition having an excellent adhesive strength, laminating processability, chemical resistance, heat-resistance and electrical properties which is used in the production of a flexible printed circuit.

An object of the present invention is to provide an adhesive suitable for use in the continuous procedure of adhering a plastic insulating film and a metal foil by means of a roll-laminator.

Another object of the present invention is to provide an adhesive for obtaining a laminate comprising a plastic insulating film and a metal foil which is sufficiently resistant to various chemical treatments in the production of a flexible printed circuit and to soldering in the assembling procedure thereof and which has excellent electrical and mechanical properties as a flexible printed circuit.

A further object of the present invention is to provide an adhesive suitable for use in processings such as adhesion of an insulating coverlay of a flexible printed circuit, multi-layer lamination of flexible printed circuits to one another, adhesion of a flexible printed circuit to a hard printed circuit and the like.

A still further object of the present invention is to provide an adhesive composition for producing a colored flexible printed circuit which is convenient in the indication and distinguishment of a circuit layer, a coverlay layer and the like in a flexible printed circuit and which is less deteriorative in adhesive strength, flexibility and the like in aging for a long period of time.

In recent years, with the development of electronical and electric instrument industry, reduction in size, reduction in weight, high reliance of instruments for communications industry, appliances and the like and simplification of the packaging system have been required and a printed circuit board having a light and flexible plastic film as an insulating base board has been desired.

The plastic films include a polyester film, a polyethylene film, a polyvinyl chloride film, a polypropylene film, a polyimide film and the like and each of them has excellent mechanical, electrical and chemical properties. Furthermore, they are excellent in flexibility, and hence, they are preferably adhered to a metal foil and then used as a printed circuit base board.

However, in general, these plastic films are poor in surface activity, and accordingly, it is very difficult to obtain an adhesion to a metal foil strong enough to satisfy requirements for a printed circuit.

Futhermore, it is very difficult to afford to the base board excellent circuit qualities and resistance to the severe treating chemicals encountered in the production and assembling of a printed circuit and there have heretofore been very few satisfactory adhesives for a flexible printed circuit.

As a general method for adhering a plastic film to a metal foil, there may be employed a method in which, as in the production of a conventional hard laminate, both the plastic film and the metal foil are heat-pressed by means of a hot press for about 0.5 to 3.0 hours. However, since the starting materials are available in the web form, there is preferred a method, generally called as "Dry-Lamination," in which an adhesive is applied to the starting materials and then the materials are adhered under pressure by passing them through hot rolls. If this method can be applied to the production of a laminate used in a flexible printed circuit, it is very advantageous economically in that the production procedure will be simplified, that the production speed will be increased and that a continuous treating procedure can be applied to the subsequent production of a printed circuit.

However, in order to employ such a laminating method using rolls, an adhesive capable of imparting important properties as a printed circuit such as strong adhesion, excellent resistance to chemicals, electrical properties and the like to a laminate which has been cured and bonded in only about 0.5 to 5.0 seconds, far shorter than in the case of a pressing method, is required, and the adhesive is required to have delicate properties such that the adhesive applied on the web does not undergo blocking in the laminating step, and that the adhesive has a flow property sufficient to cover fine unevenness on the surface of the metal foil, and the like.

It is impossible for a unitary adhesive to satisfy these many requirements. A variety of adhesive resin compositions have heretofore been examined; however no satisfactory adhesive compositions have been found when applied to a continuous laminating procedure for a flexible printed circuit base board.

The polyester resin has an excellent adhesive property to various plastic films and metal foils and is also excellent in flexibility and electrical performance, and accordingly, it is favorable as a base resin of an adhesive for a flexible metal-clad laminate.

However, when used alone, the polyester resin is inferior in resistance to organic solvents used in the processing of the laminate into a printed circuit.

When the polyester resin is reacted with an isocyanate compound to be cross-linked, the product is improved in resistance to solvents; however it is yet unsatisfactory in the application to a laminate for a flexible printed circuit.

For example, a composition comprising a saturated linear polyester and an isocyanate compound used in a laminate for packaging pharmaceuticals which comprises a polyester film and an aluminium foil is rapidly reacted at a temperature of about 150°C, is suitable for a high speed dry laminating procedure and also affords an excellent bonding strength. The composition, however, has the drawbacks that when applied to a laminate for a flexible printed circuit, it is poor in flow property at the time of passing it through heating rolls to produce the same, and that even when the composition is applied to production of a laminate for a printed circuit composed of a polyester film and a copper foil, there can be effected no uniform adhesion and the heat-resistance of the resulting laminate is poor.

It is preferable to incorporate an epoxy resin thereinto in order to improve the heat-resistance of an adhesive, but the addition of only an epoxy compound to a mixture of a polyester resin and an isocyanate compound does not result in crosslinking, and hence, no sufficient efficiency is obtained. Even when a curing agent for an epoxy compound is used, only unsuitable materials are obtained in practice because reaction between the curing agent and the isocyanate compound is preferentially effected and insoluble materials are formed before it is used as an adhesive, and unreacted epoxy compound and polyester resin remain even after lamination and thus the laminate is markedly inferior in resistance to chemicals.

Various adhesive compositions containing polyester resin as the major ingredient have problems that blocking of adhesive is caused after it is applied to a web, which therefore, adheres to the rolls in a roll-to-roll laminator and that the adhesive composition tends to adsorb dust before lamination, which causes a marked damage of the appearance of the product.

The present invention overcomes such drawbacks of the conventional compositions and provides an excellent adhesive composition which is suitable for use in a continuous roll-to-roll lamination in a short period of time and which satisfies sufficiently many characteristics required for a flexible printed circuit base board.

The main point of this invention lies in an adhesive composition composed of a mixture of a polyester resin and an isocyanate compound as the major ingredients and a B-stage epoxy resin obtained by subjecting an epoxy compound and a compound having active hydrogen atom to initial reaction.

Representative polyester resins used in the present invention are high molecular weight linear polyesters obtained by polymerization-condensation of di-basic acids with divalent alcohols and also include copolymers composed of several ingredients.

The polyester resins are usually saturated polyesters, but may contain unsaturated ingredients.

As the isocyanate compounds there may be used polyisocyanate compounds having such groups as alkyl, aryl and aralkyl and having at least two isocyanate groups in the molecule, for example, tolylene diisocyanate, diphenylmethane diisocyanate, metaphenylene diisocyanate, hexamethylene diisocyanate, triphenyl methane triisocyanate, a reaction product of tolylene diisocyanate and trimethylolpropane or compounds obtained by blocking the polyisocyanate with phenol or the like or a polyurethane prepolymer obtained by reacting an excess of the polyisocyanate with a polyol.

The reactivity of the isocyanate to the polyester resin is high and the former reacts with the latter in a very short period of time to promote cross-linking and curing of the resin, and hence, it is suitable for a laminating method by means of rolls, and the chemical-resistance of polyester resin as an adhesive is improved by cross-linking.

The amount of the isocyanate compound used depends upon the chemical equivalence thereof and the degree of cross-linking desired, but in the present invention the isocyanate compound is preferably used in an amount of 1 to 20 parts by weight per 100 parts by weight of the polyester resin. If the amount of isocyanate is less than 1 part by weight, the resistance to chemicals after lamination to a metal foil is insufficient, and if it is larger than 20 parts by weight, the reaction of the composition is so rapid that the adhesive varnish is apt to gel before use and hence unsuitable for practical use.

According to the present invention, in addition to said polyester resin and isocyanate component, there is used a B-stage epoxy resin component obtained by reacting a compound having at least two epoxy groups in the molecule with a compound having active hydrogen till the B-stage.

As the epoxy compounds, there may be used conventional epoxy compounds such as diglycidyl ethers derived from bisphenol A or halogenated bisphenol A; diepoxy compounds of cyclic olefins like cyclohexene derivatives; glycidyl ethers of novolak resins, polyphenols or polyhydroxyphenols; glycidyl ethers or esters derived from aromatic oxycarboxylic acids or aromatic dicarboxylic acids; diglycidyl esters of dimer acids; diglycidyl ethers of polyalkylene glycols and the like.

The epoxy equivalent of these compounds ranges from about 100 to 4,000, though those having an epoxy equivalent of about 100 to 1,000 are preferred.

As the curing agents, there may be used conventional curing agents having at least two active hydrogen atoms for epoxy compounds such as aliphatic amines, aromatic polyamines, dicyandiamide, aliphatic or cycloaliphatic polycarboxylic anhydrides, polyamides of dimer acids, dimercapto compounds, imidazole derivatives and the like, though the aromatic polyamines, the polycarboxylic anhydrides and dicyandiamide are preferred.

If necessary, it is possible to use a small amount of a tertiary amine, phenol or the like together with the above curing agent.

In order to form the B-stage epoxy resin by use of these curing agents, the curing agent is admixed with the epoxy compound in an equivalent ratio of 0.2 to 1.0, preferably 0.5 to 1.0 in an appropriate organic solvent and reacted at a temperature ranging from 40°C to 150°C for a period of 0.5 to 3 hours, and then cooled to obtain an epoxy resin varnish in which initial reaction has been completed.

The epoxy resin in this state has the so-called B-stage characteristics that it has the flow property similar to that of a thermoplastic resin at a high temperature and that by heating, the reaction proceeds to a three dimensional structure, whereby resin is cured.

The average molecular weight of the resin ranges from about 1,000 to 10,000, though it is preferably from about 2,000 to 6,000.

Such a small amount of unreacted curing agent and epoxy compound that they have substantially no adverse effect on other ingredients may be present.

These epoxy resins have the characteristics that they are cured in a very short period of time and the gel time thereof upon heating on a heated plate at 150°C ranges from about several seconds to 3 minutes, which is very short as compared with about 5 to 30 minutes in the case of a conventional mixture of an epoxy compound and a curing agent (so-called A-stage epoxy resin).

Therefore, the varnish applied to webs and dried to remove the solvent in a roll-laminator is sufficiently cured by such a short time reaction that the webs are press-bonded between hot rolls, to obtain excellent resistance to chemicals and heat.

These epoxy resins contain substantially no free curing agent because the curing agent is reacted with the epoxy compound to produce an adduct and accordingly, when the epoxy resin is admixed with a polyester resin-isocyanate system, preferential reaction between the curing agent and the isocyanate compound as in the case of addition of a so-called A-stage epoxy compound and a curing agent is difficult to cause, and the cross-linking of the polyester resin with the isocyanate compound is not inhibited.

Therefore, there can be produced an excellent laminate for a flexible printed circuit to which an excellent flexibility and adhering properties of the polyester resin and the heat-resistance of the epoxy resin have been imparted without bringing about undesirable side reactions such as precipitation of insoluble materials from the adhesive composition, a decrease in resistance to chemicals due to the remaining unreacted epoxy compound and polyester resin and the like.

More preferably, the addition of these B-stage epoxy resins results in a great enhancement of the flow property of the polyester resin type adhesive, and enables the adhesive to sufficiently extend to the fine unevenness on the surface of the metal foil in the roll-lamination of a plastic film to a metal foil, thereby giving a uniform adhesion.

Several excellent effects as mentioned above can only be obtained by addition of a B-stage epoxy resin of the present invention and they cannot be obtained by a conventional two component system of a polyester resin and an isocyanate or by the mere mixing of the two component system with an epoxy compound and a curing agent (so-called A-stage epoxy resin composition). The amount of the B-stage epoxy resin added ranges from 2 to 50 parts by weight, preferably 2 to 40 parts by weight, per 100 parts by weight of the polyester resin. If the amount is less than 2 parts by weight, heat-resistance and flow property are insufficient, and, if it is more than 50 parts by weight, adhesive strength becomes insufficient.

The adhesive composition of the present invention may contain, in addition to the aforesaid main components, at least one copolymer selected from the group consisting of a copolymer of aromatic vinyl compound with maleic anhydride, an alkyl ester of said copolymer, a copolymer of aromatic vinyl compound with alkyl maleate and a copolymer of aromatic vinyl compound with maleic anhydride and alkyl maleate or a metal salt of an aliphatic carboxylic acid.

These components reduce the blocking property of an adhesive consisting of a polyester resin, an isocyanate, and a B-stage epoxy resin, so that the processability in the roll-lamination of a plastic film to a metal foil is improved and dusts are hardly incorporated into laminated products. These components also promote the reaction of the adhesive composition and impart to the composition rapid curability more suitable to the mechanism of bonding in a short period of time in a roll-laminator.

The alkyl maleate in said copolymer includes mono- or diester having an alkyl group containing 1 to 20 carbon atoms, preferably 1 to 10 carbon atoms, such as ethyl, n-propyl, isopropyl, n-butyl, isobutyl, tert.-butyl, n-pentyl, n-hexyl, tert.-amyl, n-heptyl, n-octyl, 2-ethyl-1-hexyl, n-nonyl, n-decyl or the like. The esterification may be effected in the form of either a monomer or a copolymer with maleic anhydride. In the latter case, a part or the whole of the carboxyl groups in the copolymer may be esterified, and a half-esterification product is most preferable.

The aromatic vinyl compound in said copolymer includes styrene derivatives such as styrene, methylstyrene, dimethylstyrene, ethylstyrene, α-methylstyrene, α-methyl-p-isopropylstyrene, divinylbenzene, etc., or halogenated styrene derivatives, and there may also be employed a copolymer containing two or more aromatic vinyl compounds.

These copolymers prevent the blocking of the adhesive, and besides impart flexibility to the adhesive due to a long chain molecular structure and contribute to the cross-linking reaction of the epoxy resin to accelerate curing, thus improving the heat resistance and resistance to chemicals of the adhesive.

The amount of copolymers added ranges from 0.5 to 20 parts by weight per 100 parts by weight of the polyester resin. If the amount is less than 0.5 part by weight, both the prevention of blocking of an adhesive and the promoting of curing are insufficient and, if it is more than 20 parts by weight, the resistance to chemicals is reduced.

The metal salts of aliphatic carboxylic acids include metal salts of mono- or di-carboxylic acids having an alkyl, a cycloalkyl or an olefin group having 10 to 30 carbon atoms, and preferable are, for example, zine octylate, tin octylate, dibutyltin dilaurate and the like.

These prevent the blocking of the adhesive based on the effect of their long-chain alkyl groups and the like and, in addition, form a chelate bond with the resin component to promote curing. The amount added thereof ranges from 0.01 to 5 parts by weight per 100 parts by weight of the polyester resin. If it is less than 0.01 part by weight, the effects of preventing the blocking of adhesive and of promoting curing are insufficient and, if the amount is too large, the resistance to chemicals of the adhesive is reduced.

The adhesive composition of the present invention may contain a pigment. The conventional flexible printed circuit boards have a plastic film as the base and hence, most of them are white and transparent or near thereto. Recently, on the other hand, the wiring density in the electronic instruments tends to increase more and more; many kinds of printed circuit boards have been used in one instrument; and the wiring density of a printed circuit board itself has also been increased. Accordingly, in order to prevent wiring errors in the assembling of instruments, it is desired that parts-loading positions of a circuit, or connecting positions and different kinds of printed circuits be distinguished.

Particularly in a flexible printed circuit, in most cases, a film coverlay is provided for the protection of a conductive circuit; many sheets of flexible circuit are connected to the same connecting pin; and a multi-layer circuit board is formed by laminating flexible circuits to one another. Therefore, the necessity for distinguishment is great, and it is very convenient to color the circuit layers to distinguish them. Further, in some cases, the printed circuit base board is required to have a light intercepting property.

In order to color a circuit, there are various methods such as blending a coloring material at the time of production of a base film, printing, painting, plating, vacuum deposition and the like. However, all of these methods require considerable numbers of steps, apparatus, and techniques, which are undesirable in view of raw-materials, processability and economy in the case of flexible printed circuit board.

On the other hand, the use of a colored adhesive does not require a special equipment or technique and enables the economical production of a colored printed circuit by the same working as in the production of a conventional printed circuit board.

In this case, there is a great advantage that there is no need of preparing previously for some differently colored base films, but only one conventional base film can be laminated to a metal foil with adhesive compositions having different colors to obtain some printed circuits different in color.

The present invention provides an adhesive composition suitable for use in the production of such colored flexible printed circuit boards.

In accordance with the present invention, 0.5 to 15 parts by weight of a pigment having a particle diameter of up to 10 μ may be added to a mixture (1) comprising 100 parts by weight of a polyester resin, 1 to 20 parts by weight of an isocyanate compound, and 2 to 50 parts by weight of a B-stage epoxy resin, a mixture (2) comprising the mixture (1) and 0.5 to 20 parts by weight of at least one copolymer selected from the group consisting of a copolymer of aromatic vinyl compound with maleic anhydride, an alkyl ester of said copolymer, a copolymer of aromatic vinyl compound with alkyl maleate, and a copolymer of aromatic vinyl compound with maleic anhydride and alkyl maleate, and a mixture (3) comprising the mixture (1) and 0.01 to 5 parts by weight of a metal salt of an aliphatic carboxylic acid. In this case, however, the order of addition of each component and the pigment is not limited in the respective composition.

The pigments used are organic or inorganic pigments having a particle diameter of up to 10 μ, preferably up to 5 μ, insoluble in conventional solvents used in adhesive compositions, but readily dispersible therein. For example, there may be mentioned titanium oxide-based white pigment, carbon black-based black pigment, ferrocyanine blue-based blue pigment, phthalocyanine green-based green pigment, azo-based red pigment and benzidine-based yellow pigment.

These pigments are uniformly dispersed in the adhesive composition to make the surface area thereof larger and they protect the adhesive composition from blocking to make it rapid-drying and improve the processability in the production of a flexible metal-clad laminate in a roll-laminator.

When incorporated into the adhesive composition, the pigments are stable against light, and take the action of preventing the deterioration of the whole of the adhesive, and reducing a change in bonding strength and flexibility with the lapse of time.

The use of the pigment results in an excellent colored flexible metal-clad laminate which has sharply been colored and is little discolorable without decreasing the electrical performance and the like as a base board for a printed circuit.

These effects can effectively be obtained if the amount of the pigment added is within the range of from 0.5 to 15 parts by weight.

If the amount of the pigment is less than 0.5 part by weight, the sharpness of color is low and, if it is more than 15 parts by weight, the pigment deposits on the surface of adhesive to reduce the bonding strength thereof.

The pigments having a particle size of more than 10 μ are poor in dispersability, produce irregularity in color and impair the appearance of product.

When the adhesive composition of the present invention is used as an adhesive, it is dissolved in a conventional solvent such as acetone, methyl ethyl ketone, toluene, xylene, dimethylformamide, tetrahydrofurane, dioxane, methyl Cellosolve and the like and a mixture thereof as a common solvent, and the concentration thereof is adjusted to that suitable for application to a web.

When a plastic film and a metal foil are adhered by use of these adhesives, there may be employed a heat-pressing method using a conventional applying-drying apparatus and a heating press, though the most industrially advantageous method is a method of adhering them in the form of a web by means of a roll-laminator, and the adhesive composition of the present invention is extremely suitable for such a continuous lamination method.

As the method for the lamination thereof, the adhesive composition of the present invention dissolved in a solvent is applied to a plastic film and/or a metal foil at the applying portion of the roll-laminator and the solvent is evaporated in a drying zone to bring the adhesive composition to a half-cured state and both the plastic film and the metal foil are heat-pressed by passing them in an intimate contact through a hot pressing roll portion, and the laminated product is then cooled and wound up. A sequence of the procedures are carried out in a completely continuous manner by linkage of the roll in each portion.

In order to exhibit the adhering property of the adhesive of the present invention most effectively and to obtain qualities severely required as a base board for flexible printed circuit in this equipment, it is preferable that the pressing rolls consist of a metal roll such as steel roll or the like and a rubber roll such as silicone roll or the like; that the plastic film and the metal foil are passed through the pressing rolls so that the plastic film and the metal foil are brought into contact with the metal roll and the rubber roll, respectively; and that the metal foil is allowed to wrap around the rubber roll from the position on the circumference of the roll for $\pi/4$ or more radians toward the contact line of both rolls.

This method prevents the formation of wrinkles of the laminate in the pressing rolls which results primarily from thermal expansion of the highly rigid metal foil and increases the effect of transmission of heat to the adhesive to promote the fusion, adhesion and curing reaction of the adhesive by continuously heating the metal foil which passes through the pressing rolls in a short period of time, thereby imparting a high bonding strength, excellent resistance to chemicals and other properties to the laminated product. Thus, this method is very effective in the continuous laminating process to which the adhesive composition of the present invention is applied.

The adhesive layer obtained by adhering a plastic film and a metal foil according to either a roll method or a press method by use of the adhesive composition of the present invention is insoluble in organic solvents necessary in the production of printed circuit such as methyl ethyl ketone, trichloroethylene, methylene chloride, acetone, methanol, toluene, xylene and the like, resistant to chemicals such as a 10% aqueous hydrochloric acid solution, a 10% aqueous caustic soda solution, a 10% aqueous ammonium persulfate solution and the like, excellent in soldering heat resistance, flexibility, electric insulation and the like and affords an excellent base board for flexible printed circuit without impairing the characteristics of the base film.

These properties are obtained by an effective and synergistic interaction of various properties of each component which is contained in the adhesive composition of the present invention such as the flexibility, bonding strength, and rapid curability of the polyester resin/isocyanate system; the heat-resistance, rapid curability and flow property of the B-stage epoxy resin; the blocking preventing effect and crosslinking promoting effect of at least one copolymer selected from the group consisting of a copolymer of aromatic vinyl compound with maleic anhydride, an alkyl ester of said copolymer, and a copolymer of an aromatic vinyl compound with alkyl maleate, a copolymer of aromatic vinyl compound with maleic anhydride and alkyl maleate, and a metallic salt of an aliphatic corboxylic acid; the blocking preventing effect of a pigment; and the like in their respective proportions.

In particular, the rapid curability, flow porperty and blocking resistance are very suitable for a method of continuous lamination in a short period of time using a roll-to-roll system and provide the industrially most advantageous method for the production of a laminate for flexible printed circuit.

Addition of a pigment reduces changes with the lapse of time of bonding strength, flexibility, and the like of a laminate and affords excellent weather resistance and in addition, makes it possible to provide the industrially most advantageous process for the production of a colored flexible printed circuit which is easily distinguishable and suitable for a high density wiring.

The adhesive composition of the present invention can be applied to a combination of a wide range of plastic films usually employed as base boards for flexible printed circuit such as polyethyleneterephthalate, polyethylene-2,6-naphthalate, polyvinyl chloride, polyethylene, polypropylene, polyimide, poly(amide-imide), or the like and a variety of metal foils used as conductive foils for flexible printed circuit such as copper, aluminum, tin, berillium-copper or the like and is particularly suitable for adhesion of polyester film or polyvinyl chloride film to a metal foil.

In particular, a polyalkylene-2,6-naphthalate film is superior to other polyester film in heat-resistance from the nature of molecular structure. While adhesion of a polyalkylene-2,6-naphthalate film has been difficult with the conventional adhesive, the adhesive composition of the present invention is very effective in adhesion of said film. When the adhesive composition of the present invention is employed, the heat-resistance of said adhesive composition and the heat-resistance of the film are combined effectively so that the connection with a conventional eutectic solder is possible in the packaging of a printed circuit and that an inexpensive, practically very useful laminate for flexible printed circuit can be obtained.

The metal-clad laminate for flexible printed circuit of the present invention has a good flexibility required in practical use, and the thicknesses of plastic film and the metal foil are not critical, though the thickness of the plastic film is preferably 0.8 mm or less and the total thickness of both the plastic film and the metal foil is preferably 1 mm or less in a practical application.

Furthermore, due to the excellent adhesive property, flow property, electric perfermance and the like of the adhesive composition of the present invention, the composition is also suitable for use as an adhesive layer for a conventional film coverlay for the purpose of insulation, anti-corrosion and protection from bending of the conductive material of a flexible printed circuit, and it can be employed in a cover-laying procedure by roll or press after being applied to a polyester film, a polyimide film or the like.

The adhesive composition of the present invention is also suitable as an adhesive or as a film adhesive used in the backing of a flexible printed circuit with a hard board for the purpose of reinforcement of its parts-loading position, in the integral lamination of a flexible printed circuit with a hard printed circuit which is effected for the purpose of forming a high density wiring of circuit and simplification of connection, and in the multi-lamination of flexible printed circuits to one another. The adhesive property, flow property, heat-resistance and the like of the adhesive composition satisfy sufficiently the quality required for this kind of printed circuit.

This invention is further specifically explained referring to Examples, which are not by way of limitation but by way of illustration only.

EXAMPLE 1

In methyl ethyl ketone were dissolved 100 parts by weight of polyester resin having a number average molecular weight of about 20,000 obtained by co-condensation of 0.6 mole of terephthalic acid and 0.4 mole of adipic acid with 1 mole of ethylene glycol, 8 parts by weight of tolylene diisocyanate, 10 parts by weight of a B-stage epoxy resin having a number average molecular weight of about 4,500 obtained by reacting 0.8 mole of diaminodiphenylmethane with 1 mole of diglycidyl ether of bisphenol A in a mixed solvent of methyl ethyl ketone and methyl Cellosolve at a temperature ranging from 80°C to 100°C for 2 hours, and 2 parts by weight of a half-esterified product with n-heptyl alcohol of an equimolar copolymer of maleic anhydride and styrene to prepare an adhesive varnish having a concentration of 20% by weight. The resulting adhesive was applied in a thickness of about 30 $\mu$ to a polyethylene terephthalate film having a thickness of 50 $\mu$ by means of a roll-laminator in which an applying roll portion, a drying zone and a pressing roll portion are connected.

The film coated with the adhesive was dried at 120°C for 5 minutes and then adhered to a copper foil having a thickness of 35 $\mu$ by pressing them at 150°C at a pressure of 15 kg/cm$^2$ between the pressing rolls consisting of a metal roll and a rubber roll while passing the film and the copper foil through between the pressing rolls in 2 seconds so that the film coated with the adhesive was brought into contact with the metallic roll and the copper foil was in contact with the rubber roll, and that the copper foil was allowed to wrap around the rubber roll from the position on the circumference of the rubber roll for $\pi/4$ or more radians toward the contact line of both rolls, to form a flexible, copper-clad laminate.

The properties of the resulting flexible copper-clad laminate are shown in Table 1. Though the adhesion was effected at a low pressure in a short period of time, the laminate was excellent in bonding strength, resistance to chemicals and electrical properties.

In contrast thereto, when a conventional adhesive was used (in Comparative Examples 1 and 4), the resulting laminate was inferior in resistance to chemicals, heat resistance, bonding strength and the like and no sufficient performance was obtained.

EXAMPLE 2

The following four ingredients were dissolved in tetrahydrofuran to prepare an adhesive varnish having a concentration of 15% by weight in the same manner as in Example 1:

1. Polyester resin (co-condensation product of ethylene glycol, terephthalic acid and sebacic acid in a molar ratio of 1 : 0.5 : 0.5) . . . . 100 parts by weight
2. Triphenylmethane triisocyanate . . . . 4 parts by weight
3. Epoxy resin (B-stage reaction product of bisphenol A diglycidyl ether and metaphenylene diamine in a molar ratio of 1 : 0.8) . . . . 10 parts by weight
4. Copolymer of maleic anhydride and dimethylstyrene in a molar ratio of 1 : 1 . . . . 1 part by weight The resulting adhesive varnish was applied in a thickness of about 30 μ to a polyethylene-2,6-naphthalate film having a thickness of 50 μ (Q Film manufactured by Teijin Co.) and the film coated with the adhesive was dried at 130°C for 3 minutes and then adhered to a copper foil having a thickness of 35 μ by passing said film and said copper foil through between the pressing rolls at 160°C at a pressure of 20 kg/cm$^2$ in 1 second in the same manner as in Example 1.

The properties of the resulting laminate are shown in Table 1. Although the pressing was effected in a short period of time, the resulting laminate was excellent in each property, and in particular, excellent in soldering heat-resistance as compared with a laminate prepared by use of a polyethylene terephthalate film as the base.

EXAMPLE 3

Equimolar amounts of polyglycidyl ether of novolak resin (Epikote 154 manufactured by Shell Chemical Corp.) and dicyandiamide were reacted in a mixed solvent of methyl ethyl ketone and dimethylformamide at a temperature ranging from 100°C to 120°C for 3 hours to obtain a B-stage epoxy resin having a number average molecular weight of about 6,000.

The following four components including said epoxy resin were dissolved in methyl ethyl ketone to prepare an adhesive varnish having a concentration of 20% by weight:

Polyester resin (the same as in Example 1) . . . 100 parts by weight addition reaction product of 1 mole of trimethylol propane and 3 moles of toluene diisocyanate (Desmodur L produced by Bayer) . . . 5 parts by weight Epoxy resin (the aforesaid B-stage reaction product) . . . 15 parts by weight Dibutyltin dilaurate . . . 0.1 part by weight The resulting varnish was applied in a thickness of about 25 μ to a polyimide film (Kapton manufactured by DuPont) having a thickness of 50 μ in the same manner as in Example 1, and dried at 110°C for 5 minutes. The film coated with the adhesive was then adhered to a copper foil having a thickness of 35 μ by passing said film and copper foil through between the same pressing rolls as in Example 1 at 170°C at a pressure of 25 kg/cm$^2$ for 3 seconds in the same manner as in Example 1 to obtain a flexible copper-clad laminate.

The properties of this laminate are shown in Table 1. Although the pressing was effected in a short period of time, the resulting laminate was excellent in each property, and in particular, markedly excellent in soldering heat-resistance.

EXAMPLE 4

Equimolar amounts of cycloaliphatic epoxy compound Chissonox No. 221 manufactured by Chisso Co.) and methanediamine were reacted in methyl ethyl ketone at a temperature of from 60°C to 80°C for 1 hour to prepare a B-stage epoxy resin having a number average molecular weight of about 2,500.

The following 4 components including said epoxy resin were dissolved in a mixed solvent of methyl ethyl ketone and toluene to prepare an adhesive varnish having a concentration of 30% by weight.

Polyester resin (the same as in Example 2) . . . 100 parts by weight

Diphenylmethane, diisocyanate . . . . 6 parts by weight

Epoxy resin (the aforesaid B-stage reaction product) . . . 5 parts by weight

Zinc octylate . . . . 0.05 part by weight

The resulting adhesive varnish was applied in a thickness of about 15 μ to a hard polyvinyl chloride film having a thickness of 200 μ in the same manner as in Example 1, and dried at 80°C for 3 minutes. Then, the film coated with the adhesive was adhered to a copper foil having a thickness of 35 μ by passing said film and copper foil through the same pressing rolls as in Example 1 at a temperature of 120°C, at a pressure of 10 kg/cm$^2$ for 1 second in the same manner as in Example 1 to prepare a flexible copper-clad laminate.

The properties of the resulting laminate are shown in Table 1. The laminate was excelllent in bonding strength, electrical properties and the like though the pressing was effected in a short period of time.

EXAMPLE 5

For the adhesive components in Example 1, the following three components were substituted to prepare an adhesive varnish, and the resulting varnish was applied to a polyethylene terephthalate film. The film coated with the adhesive was adhered to a copper foil by means of the same pressing rolls as in Example 1 to prepare a flexible copper-clad laminate.

1. Polyester resin (Co-condensation product of ethyleneglycol, propyleneglycol and terephthalic acid in a molar ratio of 0.5 : 0.5 : 1) . . . 100 parts by weight
2. Polymethylene polyphenyl isocyanate millionate MR (manufactured by Nippon Polyurethane Co.) . . . 5 parts by weight
3. Epoxy resin (B-stage reaction product of a bisphenol A type diepoxy compound Epikote 1001 manufactured by Shell Chemical Corp. and menthane diamine in a molar ratio of 1 : 1) . . . 30 parts by weight The resulting adhesive composition was excellent in flow property at the time of roll-laminating, and, even when the film and the copper foil were adhered to each other under a low pressure in a short period of time, a laminate having an excellent appearance was obtained.

The properties of the laminate are shown in Table 1, and the laminate was excellent in bonding strength, resistance to chemicals, and electrical properties.

EXAMPLE 6

An adhesive varnish was prepared from the same 4 components as in Example 1, except that 2 parts by weight of titanium white having a particle size of about 5 μ was substituted for the half ester of a copolymer of maleic anhydride and styrene. Said adhesive varnish was applied to a polyethylene terephthalate film and the film coated with the adhesive was adhered to a copper foil in the same way as in Example 1 by means of the same roll-laminator as in Example 1 to prepare a colored flexible copper-clad laminate. The properties of the laminate are shown in Table 2. The laminate was subjected to a deterioration promoting test by use of a Weather-O-meter according to JIS-Z-2030. The irradiation times were 100 hours and 200 hours, and the latter corresponds to about one-year outdoor exposure.

Changes in bonding strength of the laminate, and bending resistance of the base board before and after irradiation with carbon arc are shown in Table 3.

EXAMPLE 7

An adhesive varnish was prepared from the same components as in Example 1, except that the half ester of a copolymer of maleic anhydride and styrene was not used. A copper-clad polyethylene terephthalate film laminate was prepared in the same manner as in Example 1 using said adhesive varnish.

The properties of the laminate are shown in Table 2. The result of the test on the weather resistance of the laminate carried out in the same manner as in Example 6 is shown in Table 3, in which the result of the test on a laminate obtained by use of a conventional adhesive is also shown, which indicates that the laminate obtained by use of the conventional adhesive was markedly inferior in weather resistance.

On the other hand, the laminate obtained by use of the adhesive of the present invention exhibited a favorable result and, in particular, the laminate obtained by use of the adhesive containing a pigment showed a very small change in bonding strength, and bending resistance, and was markedly excellent in weather resistance.

EXAMPLE 8

An adhesive varnish was prepared from the same 4 components as in Example 2, except that 10 parts by weight of phthalocyanine green having a particle size of 0.5 μ was substituted for the copolymer of maleic anhydride and dimethylstyrene. The resulting adhesive varnish was applied to a polyethylene-2,6-naphthalate film (Q Film manufactured by Teijin Co.). The film coated with the adhesive was adhered to a copper foil in the same manner as in Example 2 by means of the same roll-laminator as in Example 1 to obtain a colored flexible copper-clad laminate. The properties of the resulting laminate are shown in Table 2, and the weather resistance thereof is shown in Table 3.

EXAMPLE 9

An adhesive varnish was prepared from the same 4 components as in Example 3, except that 5 parts by weight of carbon black having a particle size of 2 μ was substituted for the dibutyltin dilaurate, and said adhesive varnish was applied to a polyimide film (Kapton manufactured by DuPont). The film coated with the adhesive was adhered to a copper foil in the same manner as in Example 3 by means of the same roll-laminator as in Example 3 to obtain a colored flexible copper-clad laminate.

The properties of the laminate are shown in Table 2, and the weather resistance thereof is shown in Table 3.

EXAMPLE 10.

An adhesive varnish was prepared from the same components as in Example 4, except that 2 parts by weight of ferrocyan blue was further used, and was applied to a polyvinyl chloride film. The film coated with the adhesive was adhered to a copper foil in the same manner as in Example 4 by means of the same roll-laminator as in Example 4 to obtain a colored, flexible, copper-clad laminate.

The properties of the laminate are shown in Table 2, and the weather resistance thereof is shown in Table 3.

EXAMPLE 11

An ether-ester type diepoxy compound having an epoxy equivalent of 500–570, a melting point of 66°–78°C and a viscosity of Gardner B-F (Epicron 1030 manufactured by Dainippon Ink Co.) and 0.6 mole of phthalic anhydride were reacted in a mixed solvent of methyl isobutyl ketone and toluene at a temperature of from 100° to 120°C to prepare a B-stage epoxy resin having a number average molecular weight of 8,000.

The following 5 components including said epoxy resin were dissolved in methyl ethyl ketone to prepare an adhesive varnish having a concentration of about 17% by weight:

1. Polyester resin (co-condensation product of ethylene glycol, terephthalic acid and isophthalic acid in a molar ratio of 1 : 0.6 : 0.4) . . . . 100 parts by weight
2. Metaphenylene diisocyanate . . . 8 parts by weight
3. Epoxy resin (the aforesaid B-stage reaction product) . . . . 40 parts by weight
4. Copolymer of maleic anhydride, mono-n-hexyl maleate and α-methylstyrene in a molar ratio of 1 : 0.5 : 0.5 . . . . 5 parts by weight
5. Copolymer of dibutyl maleate, and styrene in a molar ratio of 1 : 1 . . . 10 parts by weight The resulting varnish was applied to a polyethylene terephthalate film having a thickness of 100 μ and the film coated with the adhesive was adhered to a copper foil having a thickness of 70 μ in the same manner as in Example 1 by means of the same roll-laminator as in Example 1 to obtain a flexible copper-clad laminate.

The properties of the laminate are shown in Table 2.

EXAMPLE 12

Diglycidyl ether of an addition product of bisphenol A and propylene oxide (EP-4000 manufactured by Asahi Denka Co.), 0.8 mole of hexahydrophthalic anhydride, and 0.1 PHR of 2-ethyl-4-methyl imidazole were reacted in methyl ethyl ketone at a temperature of from 60° to 80°C for 30 minutes to obtain a B-stage epoxy resin having a number average molecular weight of about 6,500.

The following 5 components including said epoxy resin were dissolved in methyl ethyl ketone to prepare an adhesive having a concentration of about 25% by weight:

1. Polyester resin (the same as in Example 12) . . . . 100 parts by weight
2. AP Stable R (manufactured by Nippon Polyurethane Co.) Blocked isocyanate obtained by masking with phenol the isocyanate groups of the addition reaction product of 1 mole of trimethylolpropane and 3 moles of toluene diisocyanate . . . 10 parts by weight
3. Epoxy resin (the aforesaid B-stage reaction product) . . . 25 parts by weight 4. Half-ester with n-butyl alcohol of a copolymer of maleic anhydride and styrene in a molar ratio of 1 : 1 . . . . 5 parts by weight
5. Titanium white (having a particle size of 5 μ) . . . 5 parts by weight The resulting adhesive varnish was applied to a polyethylene terephthalate film having a thickness of 100 μ and the film coated with the adhesive was adhered to an aluminum foil having a thickness of 100 μ in the same manner as in Example 1 by means of the same roll-laminator as in Example 1 to prepare a flexible, aluminum-clad laminate.

The properties of the laminate are shown in Table 2, and the weather resistance thereof is shown in Table 3.

EXAMPLE 13

The adhesive varnish used in Example 3 was applied to a polyimide film having a thickness of 50 μ and dried at 630°C for 5 minutes. The film thus coated with the adhesive was adhered to a copper foil having a thickness of 35 μ by heat-pressing said film and copper foil at a temperature of 170°C at a pressure of 40 $kg/cm^2$ for 60 minutes by means of a hot press to obtain a flexible, copper-clad laminate.

The properties of the laminate were excellent, as shown in Table 2, and the adhesive composition of the present invention was also applicable to a press method.

EXAMPLE 14

A flexible printed circuit having a circular land was prepared by an etching method by use of the laminate obtained in Example 5.

Separately, the same adhesive composition was applied to a polyethylene terephthalate film having a thickness of 25 μ, and dried at 120°C for 5 minutes, after which areas corresponding to the land were punched off from the film. The thus obtained film was placed on said flexible printed circuit in a registered position and heat-pressed at a temperature of 150°C at a pressure of 30 $kg/cm^2$ for 40 minutes to adhere the film to the circuit.

The resulting covered printed circuit board had the copper foil circuit portion completely embedded in a coverlay coated with the adhesive of the present invention and the adhesive did not exude to the exposed portion of the circular land, and the printed circuit was covered very good.

The boundary portion of the coverlay of said printed circuit was not invaded by chemicals such as flux at the time of soldering. When soldering was effected under the controlled conditions at 240°C, the adhesive was not peeled off and the thus obtained printed circuit had very excellent quality.

EXAMPLE 15

Flexible printed circuits were prepared by an etching method from a one-side copper-clad board and a both-side copper-clad polyester film base obtained in the same manner as in Example 1.

Separately, the same adhesive composition was applied to one side or both sides of a polyethylene terephthalate film having a thickness of 25 μ and dried. These were used as adhesive film or coverlay for said one-side circuit or two-side circuit and adhesion was effected by heat-pressing at a temperature of 130°C at a pressure of 20 $kg/cm^2$ for 30 minutes by use of a hot press to prepare a flexible printed circuit board having 3 circuit layers. This printed circuit had the layers completely adhered with the adhesive of the present invention and the circuit was completely embedded. The adhesive of the present invention was sufficiently resistant to a variety of chemicals such as plating bath and the like used in the processing of the printed circuit.

COMPARATIVE EXAMPLE 1

The same adhesive composition as in Example 5, except that the B-stage epoxy resin component was not used, was applied to a polyethylene terephthalate film in the same manner as in Example 1. Then, the film thus coated with the adhesive was adhered to a copper foil by means of hot rolls. The adhesive was low in flow property at the time of roll-laminating and was unable to adhere the whole surface of the laminate uniformly.

As shown in Table 1, the laminate obtained was inferior in resistance to chemicals and heat.

COMPARATIVE EXAMPLE 2

100 parts by weight of bisphenol A type diepoxy compound (Epikote 1001 manufactured by Shell Chemical Corp.) and 8 parts by weight (equimolar amount) of menthanediamine were dissolved in a mixed solvent of methyl ethyl ketone and methyl Cellosolve, and the resulting solution was applied to a polyethylene terephthalate film having a thickness of 50 μ. The film thus coated with the adhesive was dried at 130°C for 5 minutes and placed over a copper foil having a thickness of 35 μ and adhered to the latter by heat-pressing said film and copper foil at a temperature of 160°C at a pressure of 60 $kg/cm^2$ for 120 minutes by means of a hot press. The resulting laminate was markedly inferior in bonding strength (0.2 $kg/cm^2$), and no excellent, flexible, copper-clad laminate was obtained.

COMPARATIVE EXAMPLE 3

In the same adhesive composition as in Example 5, an equimolar mixture (A-stage product which had not been subjected to previous reaction) of a diepoxy compound of bisphenol A type (Epilote 1001, manufactured by Shell Chemical Corp.) and menthanediamine was used as the epoxy resin component to prepare an adhesive varnish. However, the isocyanate and the diamine in the composition were reacted with each other to produce an insoluble material before use thereof. After the removal of the insoluble material by filtration, a copper-clad polyethylene terephthalate film was prepared using said adhesive varnish in the same manner as in Example 1. The resulting laminate was markedly inferior in resistance to chemicals, and no excellent laminate was obtained suitable for use as a base board for a flexible printed circuit.

COMPARATIVE EXAMPLE 4

A polyurethane solution obtained by reacting 100 parts by weight of the polyester resin used in Example 5 with 10 parts by weight of tolylene diisocyanate in tetrahydrofurane at 80°C for an hour was applied to a polyethylene terephthalate film. Separately, a mixed solution of the epoxy resin used in Comparative Example 3 and a curing agent was applied to a copper foil. The copper foil was dried at 130°C for 5 minutes and then placed over said polyester film coated with the polyurethane solution, and adhered to said polyester by heat-pressing said polyester film and copper foil at a temperature of 160°C at a pressure of 60 kg/cm² for 120 minutes by means of a hot press to obtain a flexible, copper-clad laminate. The properties of the resulting laminate were as shown in Table 1 and the laminate of this Comparative Example 4 was inferior in adhesiveness as compared with the laminate obtained according to Example 5 of the present invention.

When the adhesive of this type was applied to a roll-laminating method, the epoxy resin layer was not cured for a short period of time and resistance thereof to chemicals was markedly inferior.

Table 1

| Test items (unit) | Test standards | Treatment & conditions | Example No. / Base film | Example 1 Polyethylene terephthalate | Example 2 Polyethylene-2,6-naphthalate | Example 3 Polyimide |
|---|---|---|---|---|---|---|
| Surface resistance (Ω) | JIS C-6481 | A | | 2 × 10¹⁵ | 1 × 10¹⁵ | 8 × 10¹⁴ |
| | | c-96/40/90 | | 8 × 10¹⁴ | 6 × 10¹⁴ | 3 × 10¹⁴ |
| Volume resistance (Ω-cm) | JIS C-6481 | A | | 4 × 10¹⁶ | 1 × 10¹⁶ | 9 × 10¹⁵ |
| | | c-96/40/90 | | 5 × 10¹⁵ | 3 × 10¹⁵ | 2 × 10¹⁵ |
| Peel strength (kg/cm) | JIS C-6481 | A in the direction of 180° | | 2.2 | 1.8 | 1.6 |
| Resistance of chemicals | JIS C-6481 | Immersed at room temperature for 15 min. in trichlene, acetone and methylene chloride | | Not changed | Not changed | Not changed |
| Rending resistance of the base board (number of bendings) | JIS P-8115 | Load 100 g/mm | | 1,000 or more | 1,000 or more | 1,000 or more |
| Soldering heat resistance (°C) | JIS C-6481 | Floated in a soldering bath for 60 seconds | | at 230°C not changed | at 250°C not changed | at 260°C not changed |

| Test items (unit) | Test standards | Treatment & conditions | Example No. / Base film | Example 4 Polyvinyl chloride | Example 5 Polyethylene terephthalate | Comparative Example 1 Polyethylene terephthalate | Comparative Example 4 Polyethylene terephthalate |
|---|---|---|---|---|---|---|---|
| Surface resistance (Ω) | JIS C-6481 | A | | 6 × 10¹⁴ | 4 × 10¹⁵ | 1 × 10¹⁴ | 3 × 10¹³ |
| | | c-96/40/90 | | 1 × 10¹⁴ | 1 × 10¹⁵ | 2 × 10¹³ | 3 × 10¹² |
| Volume resistance (Ω-cm) | JIS C-6481 | A | | 5 × 10¹⁵ | 6 × 10¹⁶ | 4 × 10¹⁵ | 7 × 10¹⁵ |
| | | c-96/40/90 | | 7 × 10¹⁴ | 5 × 10¹⁵ | 9 × 10¹⁴ | 8 × 10¹⁴ |
| Peel strength (mg/cm) | JIS C-6481 | A in the direction of 180° | | 2.0 | 2.1 | 1.4 | 0.6 |
| Resistance of chemicals | JIS C-6481 | Immersed at room temperature for 15 min. in trichlene, acetone and methylene chloride | | — | Not changed | The adhesive expanded | Not changed |
| Rending resistance of the base board (number of bendings) | JIS P-8115 | Load 100 g/mm | | 200 | 1,000 or more | 1,000 or more | 700 |
| Soldering heat resistance (°C) | JIS C-6481 | Floated in a soldering bath for 60 seconds | | — | at 230°C not changed | at 200°C delaminated | at 230°C not changed |

Table 2

| Test items* (unit) | Treatment & conditions | Example No. / Base film | Example 6 Polyethylene terephthalate | Example 7 Polyethylene terephthalate | Example 8 Polyethylene-2,6-naphthalate |
|---|---|---|---|---|---|
| Surface resistance (Ω) | A | | 1 × 10¹⁵ | 5 × 10¹⁵ | 2 × 10¹⁵ |
| | c-96/40/90 | | 3 × 10¹⁴ | 7 × 10¹⁴ | 3 × 10¹⁴ |
| Volume resistance (Ω-cm) | A | | 2 × 10¹⁶ | 4 × 10¹⁶ | 9 × 10¹⁵ |
| | c-96/40/90 | | 2 × 10¹⁵ | 5 × 10¹⁵ | 4 × 10¹⁵ |
| Peel strength (kg/cm) | A In the direction of 180° | | 2.0 | 1.9 | 1.6 |
| Resistance to chemicals | Immersed at room temperature for 15 min. in trichlene, acetone and methylene chloride | | Not changed | Not changed | Not changed |

Table 2 – Continued

| Test items* (unit) | Treatment & conditions | Example No. Base film | Example 6 Polyethylene terephthalate | Example 7 Polyethylene terephthalate | Example 8 Polyethylene-2,6-naphthalate |
|---|---|---|---|---|---|
| Bending resistance of the base board (number of bendings) | Load 100 g/mm | | 1,000 or more | 1,000 or more | 1,000 or more |
| Soldering heat resistances (°C) | Floated in a soldering bath for 60 seconds | | at 230°C not changed | at 230°C not changed | at 250°C not changed |

| Test items* (unit) | Treatment & conditions | Example No. Base film | Example 9 Polymide | Example 10 Polyvinyl chloride | Example 11 Polyethylene terephthalate | Example 12 Polyethylene terephthalate | Example 13 Polyimide |
|---|---|---|---|---|---|---|---|
| Surface resistance (Ω) | A | | $6 \times 10^{14}$ | $7 \times 10^{14}$ | $6 \times 10^{15}$ | $4 \times 10^{15}$ | $7 \times 10^{14}$ |
| | c-96/40/90 | | $5 \times 10^{14}$ | $2 \times 10^{14}$ | $3 \times 10^{15}$ | $1 \times 10^{15}$ | $4 \times 10^{14}$ |
| Volume resistance (Ω-cm) | A | | $8 \times 10^{15}$ | $7 \times 10^{15}$ | $4 \times 10^{16}$ | $3 \times 10^{16}$ | $7 \times 10^{15}$ |
| | c-96/40/90 | | $4 \times 10^{15}$ | $6 \times 10^{14}$ | $8 \times 10^{15}$ | $3 \times 10^{15}$ | $3 \times 10^{15}$ |
| Peel strength (kg/cm) | A In the direction of 180° | | 1.5 | 1.9 | 2.0 | 1.8 | 1.6 |
| Resistance to chemicals | Immersed at room temperature for 15 min. in trichlene, acetone and methylene chloride | | Not changed | — | Not changed | Not changed | Not changed |
| Bending resistance of the base board (number of bendings) | Load 100 g/mm | | 1,000 or more | 200 | 1,000 or more | 1,000 or more | 1,000 or more |
| Soldering heat resistance (°C) | Floated in a soldering bath for 60 seconds | | at 260°C not changed | — | at 230°C not changed | at 230°C not changed | at 260°C not changed |

*The test standards were the same as in Table 1.

Table 3

Deterioration Accelerating Test

| Example No. | Properties / Irradiation time | Peel strength (kg/cm)* 0 hr. | 100 hrs. | 200 hrs. | Bending resistance** (Number of bendings) 0 hr. | 100 hrs. | 200 hrs. |
|---|---|---|---|---|---|---|---|
| Example 6 | | 2.0 | 2.0 | 1.9 | 1,000 or more | 1,000 or more | 950 |
| Example 7 | | 1.9 | 1.6 | 1.4 | 1,000 or more | 820 | 660 |
| Example 8 | | 1.6 | 1.5 | 1.4 | 1,000 or more | 1,000 or more | 930 |
| Example 9 | | 1.5 | 1.5 | 1.4 | 1,000 or more | 1,000 or more | 810 |
| Example 10 | | 1.9 | 1.7 | 1.7 | 200 | 170 | 160 |
| Example 12 | | 1.8 | 1.8 | 1.6 | 1,000 or more | 1,000 or more | 890 |
| Comparative Example 1 | | 1.4 | 0.6 | 0.3 | 1,000 or more | 640 | 350 |
| Comparative Example 4 | | 0.6 | 0.3 | 0.1 | 700 | 500 | 220 |

*According to JIS C-6481 (in the direction of 180°)
**According to JIS P-8115 (Load: 100 g/mm, Bending radius : 0.8 mm R. The number of bendings was determined until the surface of an adhesive became whitened or the base board was cut off.)

What is claimed is:

1. An adhesive composition for a flexible printed circuit comprising a mixture of (A) a high molecular weight linear polyester resin obtained by polycondensation of dibasic acids and divalent alcohols; (B) 1–20 parts by weight, per 100 parts by weight of said polyester resin, of a polyisocyanate compound having at least two isocyanate groups in the molecule selected from the group consisting of a polyisocyanate having such groups as alkyl, aryl and aralkyl, and a reaction product of tolylene diisocyanate and trimethylol propane; and (C) 2 to 50 parts by weight, per 100 parts by weight of said polyester resin, of a B-stage epoxy resin containing substantially no free curing agent and having a number average molecular weight of from 1,000 to 10,000, and obtained by reacting a compound having at least two epoxy groups in the molecule and the epoxy equivalent of from 100 to 4,000 with a compound containing at least two active hydrogen atoms in an equivalent ratio of from 0.2 to 1.0 mole of active hydrogen compound to 1.0 mole of epoxy compound.

2. An adhesive composition for a flexible printed circuit comprising a mixture of (A) a high molecular weight linear polyester resin defined in claim 1; (B) 1 to 20 parts by weight of an isocyanate compound selected from the group consisting of a blocked polyisocyanate obtained by reacting a polyisocyanate defined in claim 1 with phenol or the like, and a polyurethane prepolymer obtained by reacting an excess of a polyisocyanate defined in claim 1 with a polyol per 100 parts by weight of said polyester; and (C) 2 to 50 parts by weight of a B-stage epoxy resin defined in claim 1, per 100 parts by weight of said polyester resin.

3. An adhesive composition for a flexible printed circuit comprising a mixture of the ingredients defined in claim 1 and (D) 0.5 to 20 parts by weight of at least one copolymer selected from the group consisting of a copolymer of styrene and/or styrene derivatives with maleic anhydride, an alkyl ester of said copolymer, and a copolymer of styrene and/or styrene derivatives with an alkyl maleate which is mono- or diester having an alkyl group of 1 to 20 carbon atoms, and a copolymer of styrene and/or styrene derivatives with maleic anhydride and said alkylmaleate, per 100 parts by weight of polyester resin defined in claim 1.

4. An adhesive composition for a flexible printed circuit comprising a mixture of the ingredients defined in claim 1 and (E) 0.01 to 5 parts by weight of a metal salt of an aliphatic mono- of di-carboxylic acids having alkyl, cycloalkyl or olefin group of 10 to 30 carbon atoms, per 100 parts by weight of polyester resin defined in claim 1.

5. An adhesive composition for a flexible printed circuit comprising a mixture of the ingredients defined in claim 1 and (F) 0.5 to 15 parts by weight of a pigment having a particle size of up to 10 $\mu$, insoluble in conventional solvents used in adhesive compositions, but readily dispersible therein, per 100 parts by weight of polyester resin defined in claim 1.

6. An adhesive composition for a flexible printed circuit comprising a mixture of the ingredients defined in claim 2 and (F) 0.5 to 15 parts by weight of a pigment having a particle size of up to 10 $\mu$, insoluble in conventional solvents used in adhesive compositions, but readily dispersible therein, per 100 parts by weight of polyester resin defined in claim 2.

7. An adhesive composition for a flexible printed circuit comprising a mixture of the ingredients defined in claim 3 and (F) 0.5 to 15 parts by weight of a pigment having a particle size of up to 10 $\mu$, insoluble in conventional solvents used in adhesive compositions, but readily dispersible therein, per 100 parts by weight of polyester resin defined in claim 3.

8. An adhesive composition for a flexible printed circuit comprising a mixture of the ingredients defined in claim 4 and (F) 0.5 to 15 parts by weight of a pigment having a particle size of up to 10 $\mu$, insoluble in conventional solvents used in adhesive composition, but readily dispersible therein, per 100 parts by weight of polyester resin defined in claim 4.

* * * * *